United States Patent
Reese

(10) Patent No.: US 10,720,927 B1
(45) Date of Patent: Jul. 21, 2020

(54) SELECTIVELY DISABLED OUTPUT

(71) Applicant: Altera Corporation, San Jose, CA (US)

(72) Inventor: Laura Reese, Campbell, CA (US)

(73) Assignee: Altera Corporation, San Jose, CA (US)

(*) Notice: Subject to any disclaimer, the term of this patent is extended or adjusted under 35 U.S.C. 154(b) by 199 days.

(21) Appl. No.: 15/400,833

(22) Filed: Jan. 6, 2017

Related U.S. Application Data

(60) Continuation of application No. 15/184,921, filed on Jun. 16, 2016, now Pat. No. 9,755,650, which is a continuation of application No. 14/089,364, filed on Nov. 25, 2013, now abandoned, which is a division of application No. 12/332,789, filed on Dec. 11, 2008, now Pat. No. 8,604,823, which is a division of application No. 11/435,416, filed on May 16, 2006, now Pat. No. 7,479,798.

(51) Int. Cl.
 *H03K 19/177* (2020.01)
 *H03K 19/17768* (2020.01)
 *H03K 19/1776* (2020.01)

(52) U.S. Cl.
 CPC ... *H03K 19/17768* (2013.01); *H03K 19/1776* (2013.01)

(58) Field of Classification Search
 CPC ....... H03K 19/17728; H03K 19/17704; H03K 19/1733; H03K 19/17736; H03K 19/1737; H03K 19/1776; H03K 19/17744; G06F 17/5054
 See application file for complete search history.

(56) References Cited

U.S. PATENT DOCUMENTS

| | | | |
|---|---|---|---|
| 4,598,170 A | 7/1986 | Piosenka et al. | |
| 4,812,675 A * | 3/1989 | Goetting | G11C 7/24 326/39 |
| 5,010,331 A | 4/1991 | Dias et al. | |
| 5,309,394 A | 5/1994 | Wuertz et al. | |
| 5,452,355 A | 9/1995 | Coli | |
| 6,212,639 B1 | 4/2001 | Erickson et al. | |
| 6,351,814 B1 * | 2/2002 | Batinic | G06F 21/76 380/264 |
| 6,518,823 B1 | 2/2003 | Kawai | |
| 6,711,684 B1 * | 3/2004 | Moroney | G06F 21/572 713/191 |
| 6,996,713 B1 | 2/2006 | Trimberger | |
| 7,028,191 B2 | 4/2006 | Michener et al. | |

(Continued)

OTHER PUBLICATIONS

Wolfgang Hoglich, Xilinx, Product obolete/under obsolescence, using the XC4000 readback capability, downloaded on Mar. 6, 2006, pp. 8-37 through 8-44.

*Primary Examiner* — Seokjin Kim
(74) *Attorney, Agent, or Firm* — Fletcher Yoder, P.C.

(57) ABSTRACT

Circuits, methods, and apparatus are directed to an integrated circuit having a disabling element that can disable a reading of data from the circuit. Once the disabling element is set to not allow a reading of the data, the disabling element cannot be changed to allow a reading of the data. The data may be configuration data or internal data stored within the integrated circuit. Examples of the disabling element include a memory element, a break in a circuit line, and an input pad configuration.

21 Claims, 8 Drawing Sheets

(56) References Cited

U.S. PATENT DOCUMENTS

| | | |
|---|---|---|
| 7,197,647 B1 | 3/2007 | Van Essen et al. |
| 7,299,203 B1 | 11/2007 | Nelson |
| 7,325,141 B2 | 1/2008 | Chow et al. |
| 7,398,554 B1 * | 7/2008 | Falik .................. G06F 21/71 365/185.04 |
| 7,442,583 B2 | 10/2008 | Bonaccio et al. |
| 7,479,798 B1 | 1/2009 | Reese |
| 7,734,043 B1 * | 6/2010 | Jefferson ............. G06F 21/76 380/37 |
| 2001/0015919 A1 | 8/2001 | Kean |
| 2002/0114455 A1 | 8/2002 | Asahi et al. |
| 2002/0145931 A1 | 10/2002 | Pitts |
| 2002/0199110 A1 | 12/2002 | Kean |
| 2003/0233524 A1 | 12/2003 | Poisner |
| 2004/0059925 A1 | 3/2004 | Benhammou et al. |
| 2004/0186991 A1 | 9/2004 | Kobayashi et al. |
| 2004/0223618 A1 * | 11/2004 | Dellow ................ H04L 9/0631 380/277 |
| 2005/0113070 A1 | 5/2005 | Okabe |
| 2005/0180572 A1 | 8/2005 | Graunke |
| 2005/0289355 A1 | 12/2005 | Kitariev et al. |
| 2006/0064537 A1 * | 3/2006 | Oshima ................ G06F 3/0614 711/103 |
| 2006/0087883 A1 | 4/2006 | Ozguz et al. |
| 2006/0092049 A1 | 5/2006 | Dellow |
| 2006/0117122 A1 | 6/2006 | Hannah |
| 2007/0039060 A1 * | 2/2007 | Jamieson ............ G06F 12/1433 726/34 |
| 2007/0200960 A1 | 8/2007 | Bennett et al. |
| 2007/0288765 A1 | 12/2007 | Kean |
| 2008/0143373 A1 | 6/2008 | Bonaccio et al. |

* cited by examiner

SELECTIVELY DISABLED OUTPUT

CROSS-REFERENCE TO RELATED APPLICATIONS

Under 35 U.S.C. § 120, this application is a continuation of U.S. patent application Ser. No. 15/184,921 filed Jun. 16, 2016, which is a continuation of U.S. patent application Ser. No. 14/089,364 filed on Nov. 25, 2013, which is a divisional of U.S. patent application Ser. No. 12/332,789 filed on Dec. 11, 2008, now U.S. Pat. No. 8,604,823, which is a divisional of U.S. patent application Ser. No. 11/435,416 filed on May 16, 2006, now U.S. Pat. No. 7,479,798, which are all incorporated by reference herein in their entireties for all purposes.

BACKGROUND

The present invention relates to field programmable gate arrays (FPGAs) generally, and more particularly to selectively disabling the reading of output of configuration and/or internal data from an FPGA.

Field programmable gate array devices are logic or mixed signal devices that may be configured to provide desirable user-defined functions. FPGAs are typically configured by receiving configuration data from a configuration device. This configuration data may be referred to as a configuration bitstream or program object file (POF). The configuration bitstream opens and closes switches formed on an FPGA such that a desired electrical configuration is achieved.

Modern FPGAs contain hundreds of thousands of logic gates, as well as processors, memories, dedicated analog function blocks, and other circuits. This extensive circuitry requires a correspondingly long configuration bitstream to configure it. For example, 55 Megabits of configuration data are now needed by some FPGAs.

This configuration data represents an FPGA user design that is the outcome of a huge investment in manpower and research and development costs, often in the million dollar range. To protect this investment, it would be beneficial to prevent reading out of the configuration data, as well as any internal data, particularly internal data that may give away the configuration data.

However, it can be beneficial in error correction during field use, as well as during design debugging, for an end user to have access to the data on an FPGA. In some applications where the error correction is critical, some FPGA designers and manufacturers are willing to forego security concerns, such as in the medical field, aerospace, and telecommunications.

Thus, what is needed are circuits, methods, and apparatus that selectively determine a setting for the allowance of access to certain data while preventing the end user from altering this setting. Additionally, it would be beneficial for the selection to be easily implemented, cost effective, and secure.

SUMMARY

Accordingly, embodiments of the present invention provide circuits, methods, and apparatus directed to an integrated circuit having a disabling element that allows for the protection of data on the circuit. Once the disabling element is set to disable access, it cannot be changed to allow access.

In one exemplary embodiment of the present invention, an integrated circuit has storage circuits capable of storing data. The data may be configuration data for configuring the functionality of the integrated circuit or internal data. The circuit also has a readout circuit for outputting the data. A first state of a disabling element allows a user to read the data, and a second state disables the reading of the data. Once the disabling element is in the second state, the disabling element cannot enter the first state.

In another exemplary embodiment of the present invention, when the disabling element is in the second state, the data is encrypted before being output thus preventing the reading of the data. A plurality of bits, which are not the data, may also be output.

In one embodiment, when the disabling element is in the second state, the outputting of the data is prevented. The disabling element may be a break in a circuit line. The disabling element may inhibit the read enable signal to the storage circuits. The disabling element may include many different devices, such as a fuse, an input pad, and a memory element. The memory element may be a one-time programmable memory. The disabling element also may include logic as well as additional memory elements.

In another exemplary embodiment of the present invention, a method prevents a reading of data on an integrated circuit capable of outputting the data. The method determines whether to allow a reading of the data based on a setting of a disabling element. Once set to not allow a reading of the data, the disabling element cannot be changed to allow a reading of the data. To prevent reading the data, the data may be encrypted before the data is output. The method may also output a plurality of bits instead of the data when the disabling element is set to not allow reading of the data. Output of data may also be prevented. The preventing may be by not transmitting a signal on the integrated circuit. The not transmitting may be due to a blown fuse. The preventing may also include inhibiting a read enable signal.

In another exemplary embodiment of the present invention, a method is provided to manufacture an integrated circuit. The method provides storage circuits capable of storing data; couples the storage circuits with a readout circuit for outputting the data; couples the readout circuit with an output pad of the integrated circuit; and activates a disabling element such that the reading of the data is permanently disabled. The activating may include providing an encryption code; providing at least one bit for outputting, instead of outputting the data; blowing a fuse; coupling an input pad with a specified voltage; and loading a value into the disabling element. The disabling element may be a memory element. The method also may couple logic with the memory element, where the logic has the loaded value as an input, and couple the logic with the readout circuit.

DETAILED DESCRIPTION

Embodiments of the present invention are directed generally to integrated circuits, particularly programmable logic devices. These devices are typically configured with configuration data containing proprietary designs. This proprietary data may be encrypted before being input into the device, but the device may decrypt the data to implement the design. Embodiments of the present invention selectively disable access to the unencrypted data on the circuit.

Figure 1:
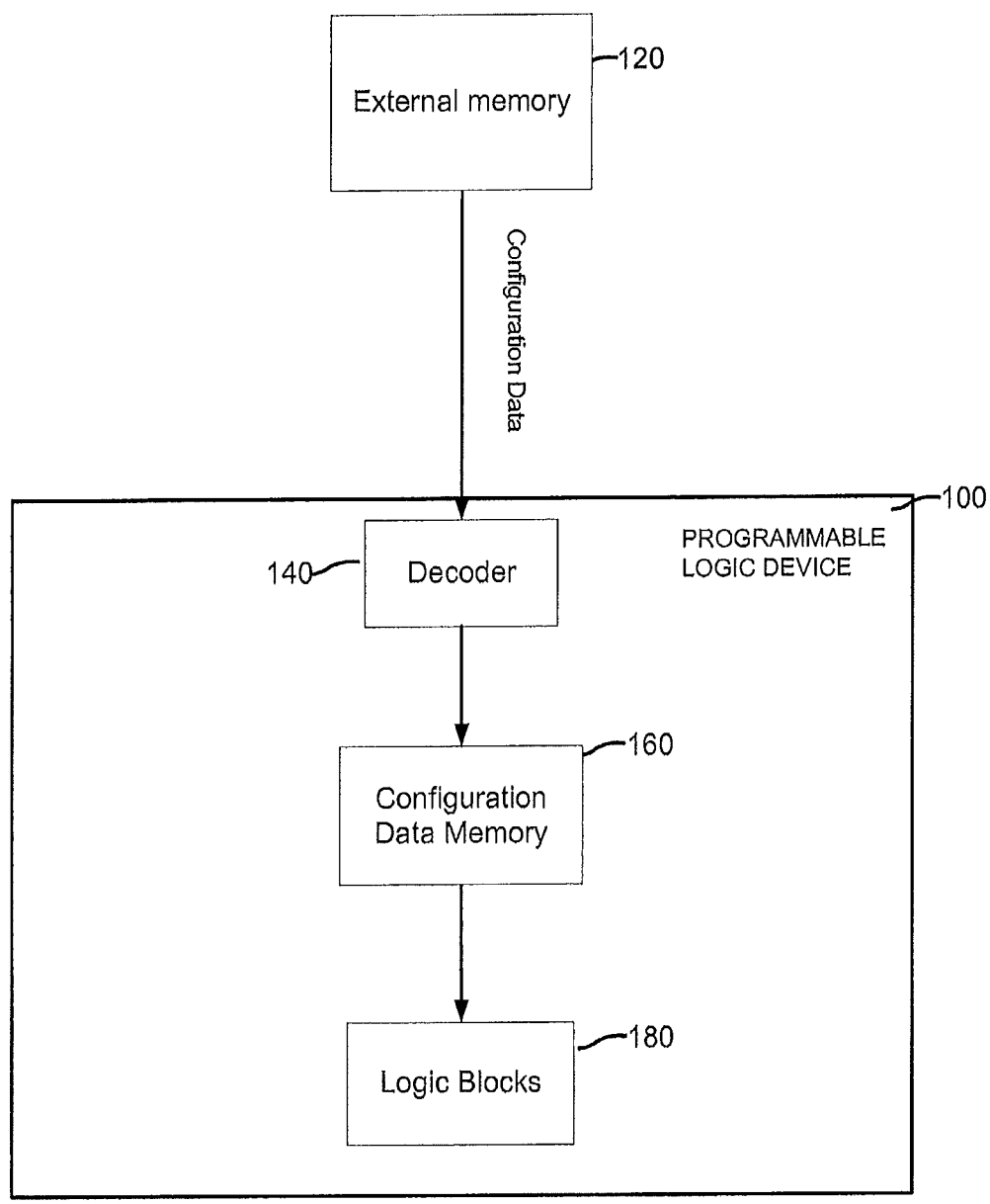
FIG. 1 illustrates a programmable logic device which receives encrypted configuration data.

FIG. 1 shows a programmable logic device 100. The external memory 120 contains configuration data, typically containing proprietary designs, that is used to configure the functionality of the logic device 100. The configuration of logic device 100 may occur upon powering up the device, rebooting, or at some other re-programming time. For example, upon powering up, the configuration data will be sent from the external memory 120 to the logic device 100. The configuration data may be encrypted in order to prevent copying when the data is in transit.

The encrypted data is sent to the logic device 100 where it is decrypted by a decoder 140. The decoder may use an array of one or more fuses, which are left intact or blown so as to create a sequence, such as a key, that decodes the data. The decrypted data is then stored in configuration data memory 160. The configuration data is used to configure the functionality of logic blocks 180. After configuration, the logic blocks 180 may start operating on input data. When in operation, the logic blocks 180 may store internal data, e.g. in data registers, RAM, or other suitable storage. This internal data may reflect specific aspects of the configuration data. Additionally, in non-programmable devices the internal data may reflect proprietary aspects of the circuit design which may be desired to be kept secret.

In some situations, it is beneficial to have the end user of the logic device 100 to have access to the decrypted configuration data and/or the internal data. For example, during operation of the circuit, an error can occur. Depending on the type of error, an end user might want to examine the configuration and/or internal data of the logic device 100. This examination might be for initially detecting an error or for the debugging and analysis of the error after detection.

Such errors include a single event effect (SEE). An SEE is any measurable error which occurs in a circuit, such as device 100, when the circuit is struck by an energetic particle. One type of SEE is a single event upset (SEU) where the charged particle causes unwanted effects in a latch state or memory cell of the circuit. The effect is that a single bit changes state, thus SEUs are referred to as bitflips.

A bitflip in memory 160 can alter the configuration data, and thus possibly change the functionality of the device 100. SEUs are "soft" errors and can be fixed by reprogramming memory 160 with the configuration data in external memory 120. The external memory 120 is usually more stable, thus more reliable, than the configuration data memory 160.

As the error may be fixed, the out-of-service time of logic device 100 can be kept very short if the error is detected and debugged quickly. For example, the re-programming may be done automatically on redundant units once an error is detected. Accordingly, in instances where the out-of-service time needs to be very short or practically zero, the end user needs to have access to the configuration data. The internal data may also be affected by an SEU, and it may also be used to detect or debug the error.

Figure 2:
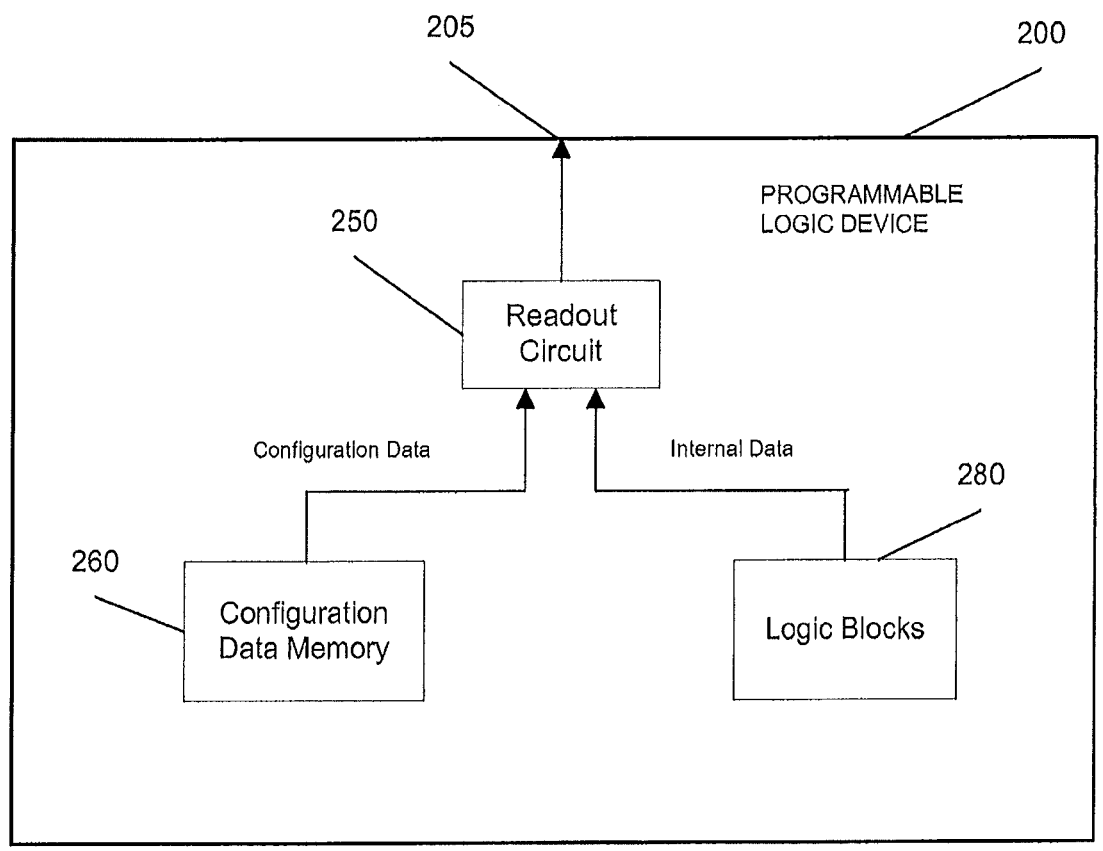
FIG. 2 illustrates a programmable logic device which is capable of reading out configuration data.

FIG. 2 shows a logic device 200 where the configuration data or the internal data may be read out. The readout of the data is handled by a readout circuit 250. The readout circuit receives the configuration data from the configuration data memory 260 and the internal data from the logic blocks 280. The readout circuit 250 outputs the data through output port 205.

In some situations, the manufacturer or designer of a circuit does not want an end user to read out such data. This may be for the same reasons that the configuration data may be encrypted, which is to prevent copying or otherwise acquiring proprietary information concerning the circuit. Depending on which internal data is read out, this internal data may also give away functional information as to device 200, to which the manufacturer may not want the end user to have access. Examples of these situations may be in non-critical uses, such as in cell phones where the effects of a malfunction due to an error are minimal. Also, the end user can easily recognize a need to reboot or reprogram the circuit.

To prevent access to the data in these situations, a manufacturer could decide to not include a readout circuit in the circuit design. However, if the manufacturer would like to produce devices where the data can be read out as well as devices where that the data cannot be read out, then there must be two different designs and possibly two separate manufacturing processes. The additional design would increase the cost of each circuit. Also, circuits that could be read out would not be able to be converted to circuits that cannot be read out.

Alternatively, a manufacturer could include a readout circuit, but attempt to restrict access to the data using configuration data to configure the device to not allow reading out of the data. This would have some of the same drawbacks of not having a readout circuit. Additionally, an end user could change the encrypted configuration data as it is sent to the circuit to allow access to the unencrypted configuration data. Thus, the purpose of preventing access to the proprietary designs would be defeated.

Figure 3:
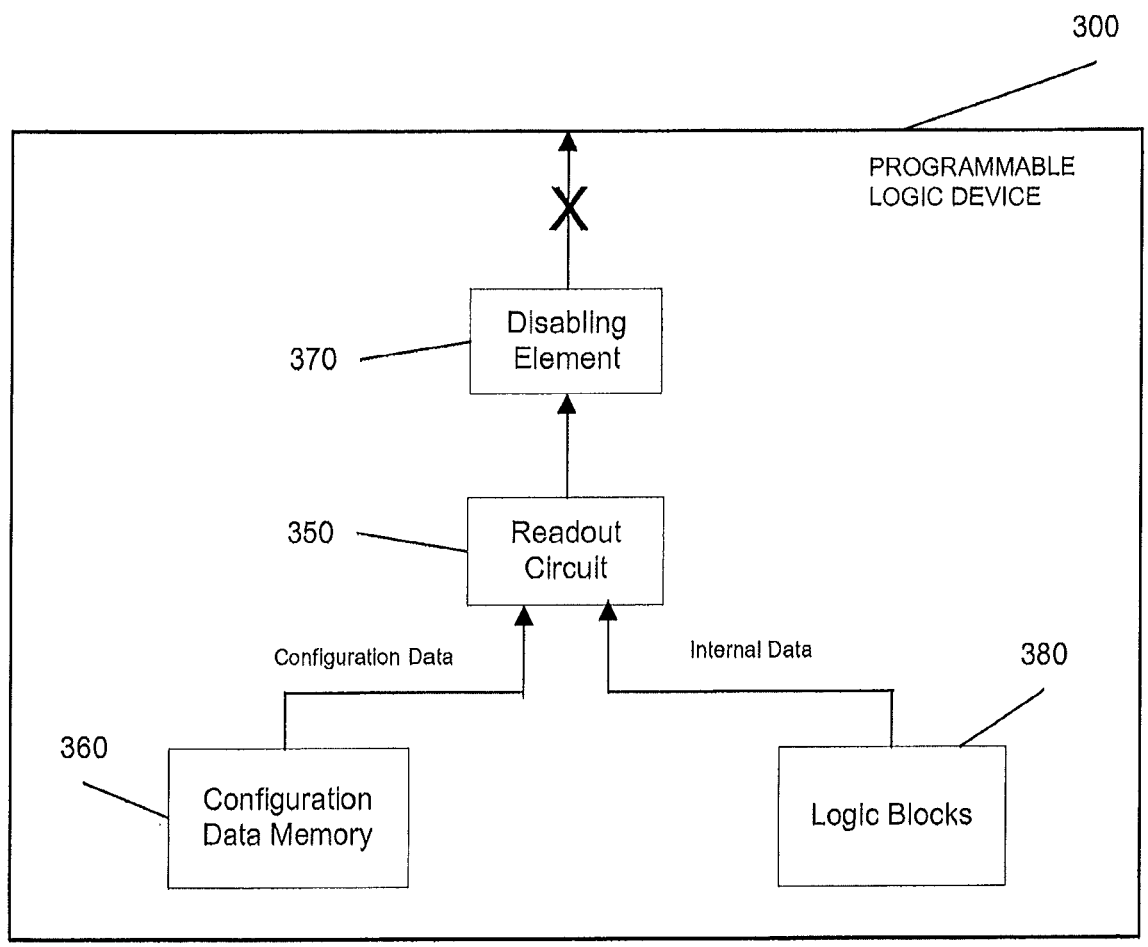
FIG. 3 illustrates a programmable logic device having a disabling element after the readout circuit and capable of preventing access to configuration and/or internal data according to an embodiment of the present invention.

To this end, FIG. 3 shows a logic device 300 according to an embodiment of the invention. The disabling element 370 may be used to prevent an output of the data from the readout circuit 350 by an end user. If the disabling element 370 is activated, an end user does not have access to the configuration data from the memory 360 and the internal data from logic blocks 380. If the disabling unit is not activated, the end user does have access to the configuration data from the memory 360 and the internal data from logic blocks 380. Additionally, if the disabling element 370 is activated, the end user cannot change the disabling element 370 so as to allow access. In some embodiments, the disabling unit may be activated in a post-manufacturing step.

In one embodiment, the disabling element 370 is a break in a circuit line. The break may include a programmable interconnect that is permanently turned off. A programmable interconnect includes traces or wires that can be programmably connected or disconnected using pass transistors, pass gates, tristate gates, multiplexers, or other appropriate circuit. An interconnect may be turned off by affecting an output or an input, including control inputs such as a gate or enable signal. For example, an additional break in the circuit line from the gate to a voltage line may be made by using or blowing a fuse, polyfuse, a fuse-metal link, a polysilicon link, a zener diode, or an anti-fuse. These elements could also be used to select which input goes to the gate or enable signal.

Such a break in the electrical connection is not accessible to the end user because the end user does not know where the break occurs, and the break is not easily repaired to restore the electrical connection. If the break is designed to be permanent, the break may be described as a one-time programmable memory. In one embodiment, a polyfuse of the same type that is used for encrypting/decrypting the configuration data is used in the disabling element.

These fuses are typically polysilicon fuses that are blown or left as a connection. Alternately, the fuses in this figure and the other included examples may be replaced by other nonvolatile memory structures, for example where the means for writing or erasing data stored in the memory structures is permanently disabled once the key is written. For example, a flash memory may be used, where the write enable line is disabled by blowing a fuse once the key is written. In one embodiment, the disabling element in the circuit may be hidden from detection by the end user by obfuscating the disabling element.

The disabling element may also utilize logic, such as an AND gate, to prevent transmission of a signal. In this example, the break in a circuit line may be due to one input to an AND gate always being low. The value may be low as that is the value stored in a memory element or due to a break in the input circuit line to the AND gate. Other logic circuits may be used along with other suitable constant input values.

In another embodiment, the disabling element 370 may disable access to the data by encrypting the data before it is output. As encrypted data is output, the end user does not have access to the data. If desired, the encryption key may be given to an end user.

Figure 4:
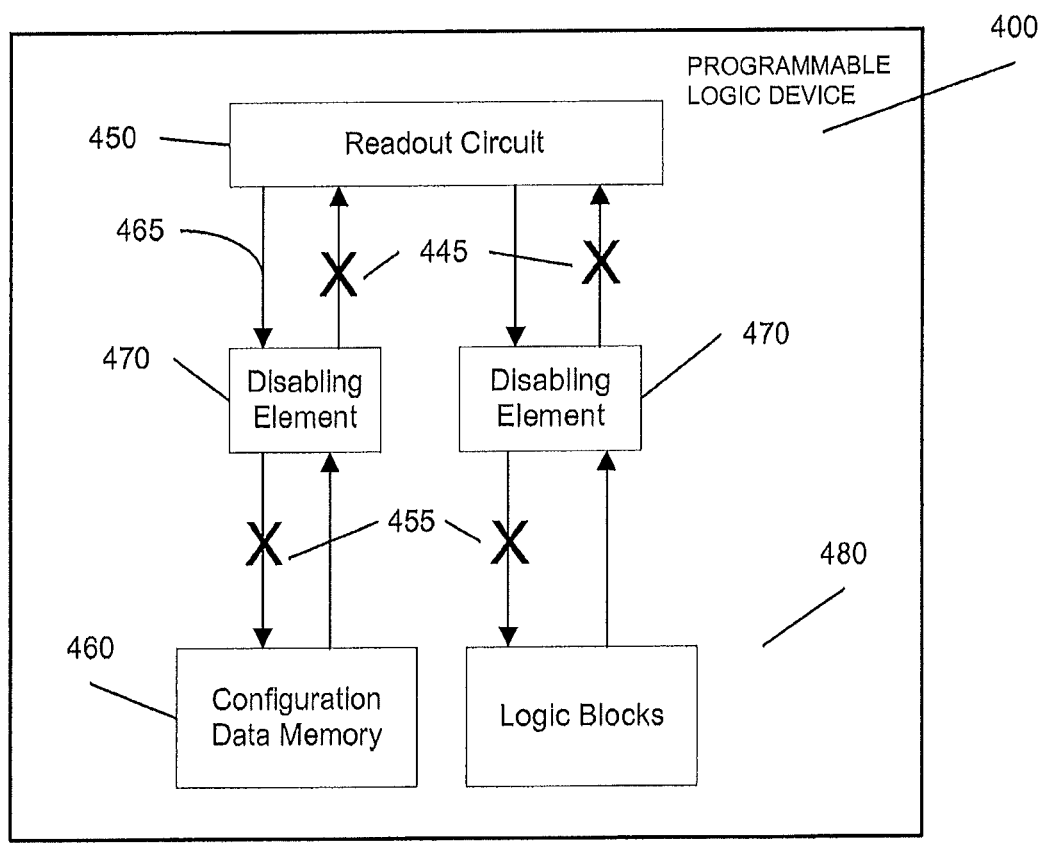
FIG. 4 illustrates a programmable logic device having a disabling element before the readout circuit and capable of preventing access to configuration and/or internal data according to an embodiment of the present invention.

FIG. 4 shows a logic device 400 according to another embodiment of the invention. The disabling element 470 is positioned before the readout circuit 450. In one embodiment, the configuration data from the memory 460 and/or the internal data from logic blocks 480 are prevented from reaching the readout circuit 450, thus preventing reading out the data from the device 400. The blocking of the data signals is shown with an "X" 445 over the lines from the disabling elements 470 to the readout circuit 450.

In another embodiment, the disabling element 470 prevents the read enable signal of the readout circuit 450 from reaching the configuration data memory 460 or the logic blocks 480. The blocking of the data signals is shown with an "X" 455 over the lines from configuration data memory 460 or the logic blocks 480 to the disabling elements 470. In another embodiment, the disabling element 470 may disable access to the data by encrypting the data.

Figure 5:
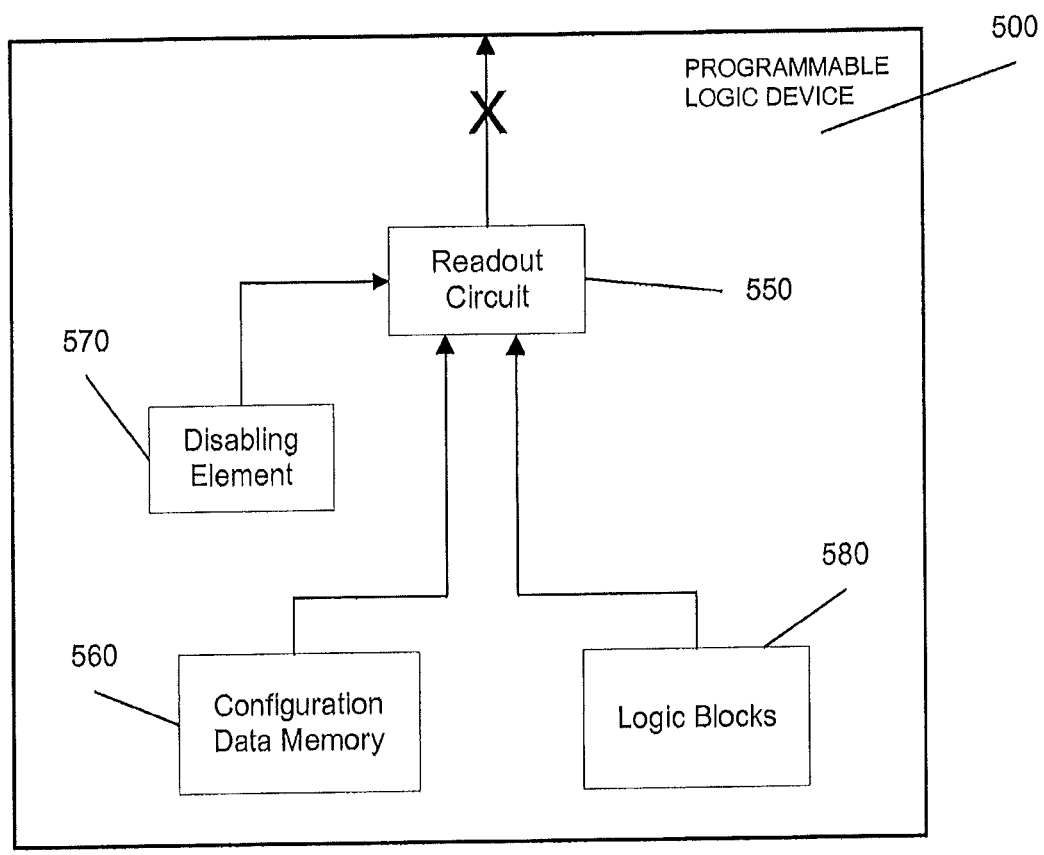
FIG. 5 illustrates a programmable logic device having a disabling element coupled with the readout circuit and capable of preventing access to configuration and/or internal data according to an embodiment of the present invention.

FIG. 5 shows a logic device 500 according to another embodiment of the invention. In this embodiment, the disabling element 570 is not directly in the path of the output of the data. Instead the disabling element 570 acts as an input to the readout circuit 550. Depending on the state of the disabling element 570, the readout of the data may be allowed or not allowed. The disabling element is not accessible by the end user.

For example, the disabling element 570 could be one or more registers, memory, or other suitable storage device whose contents determine whether reading out of the data will be allowed. The activation of the disabling element 570 may be done at a post-manufacturing step that loads a value into the disabling element that will disable reading out the data. Also, the logic device 500 may be made with the readout circuit 550 disabled and a value may be loaded into the disabling element 570 at a later point in time to enable the readout circuit 550. End user access may be prevented by not providing any mechanism for loading a value into the disabling element 570 via an input pin after activation.

In one embodiment, the storage is with a fuse or similar device as explained with respect to FIG. 3. The disabling element 570 could be effectively hidden from an end user as the disabling element 570 would not appear in a schematic or connected to an input. In another embodiment, the value that defines the state of the disabling element may be stored in the one or more logic blocks 580. The end user does not have access to the disabling element 570 as the user does not know which logic block or where in the logic block is the one or more bits that control the disabling element. In one embodiment, there is no mechanism for the end user to directly load a value into the specific memory of logic block 580, thus making it even less accessible.

In another embodiment, the state of the disabling element 570 may determine whether to encrypt the data. The disabling element 570 may also use a value stored within it to encrypt the data, or it may use data stored elsewhere.

Figure 6:
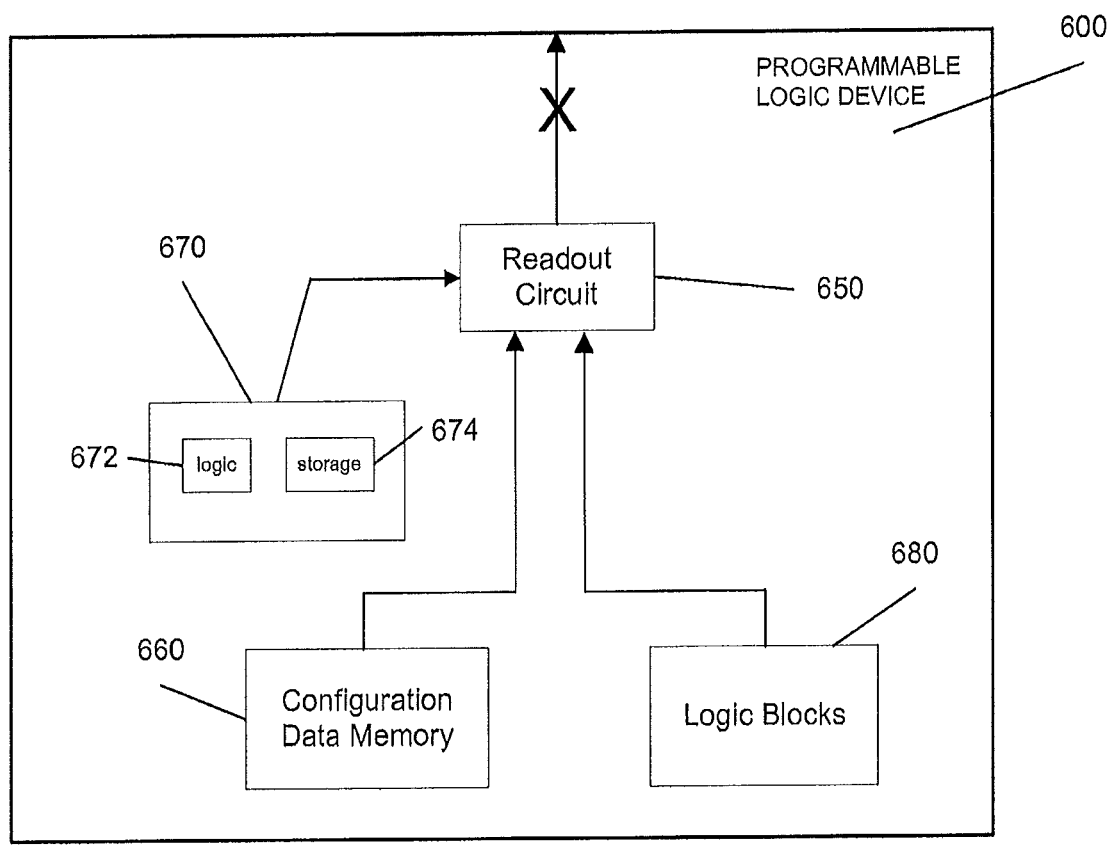
FIG. 6 illustrates a programmable logic device having a disabling element with storage and logic and capable of preventing access to configuration and/or internal data according to an embodiment of the present invention.

FIG. 6 shows an integrated circuit 600 according to an embodiment of the invention. In one embodiment, the disabling element 670 contains logic elements 672 for manipulating stored values in order to determine whether to allow access to the data. Disabling element 670 may also contain the storage 674 of the values that are used in determining whether to allow access to the data.

Figure 7:
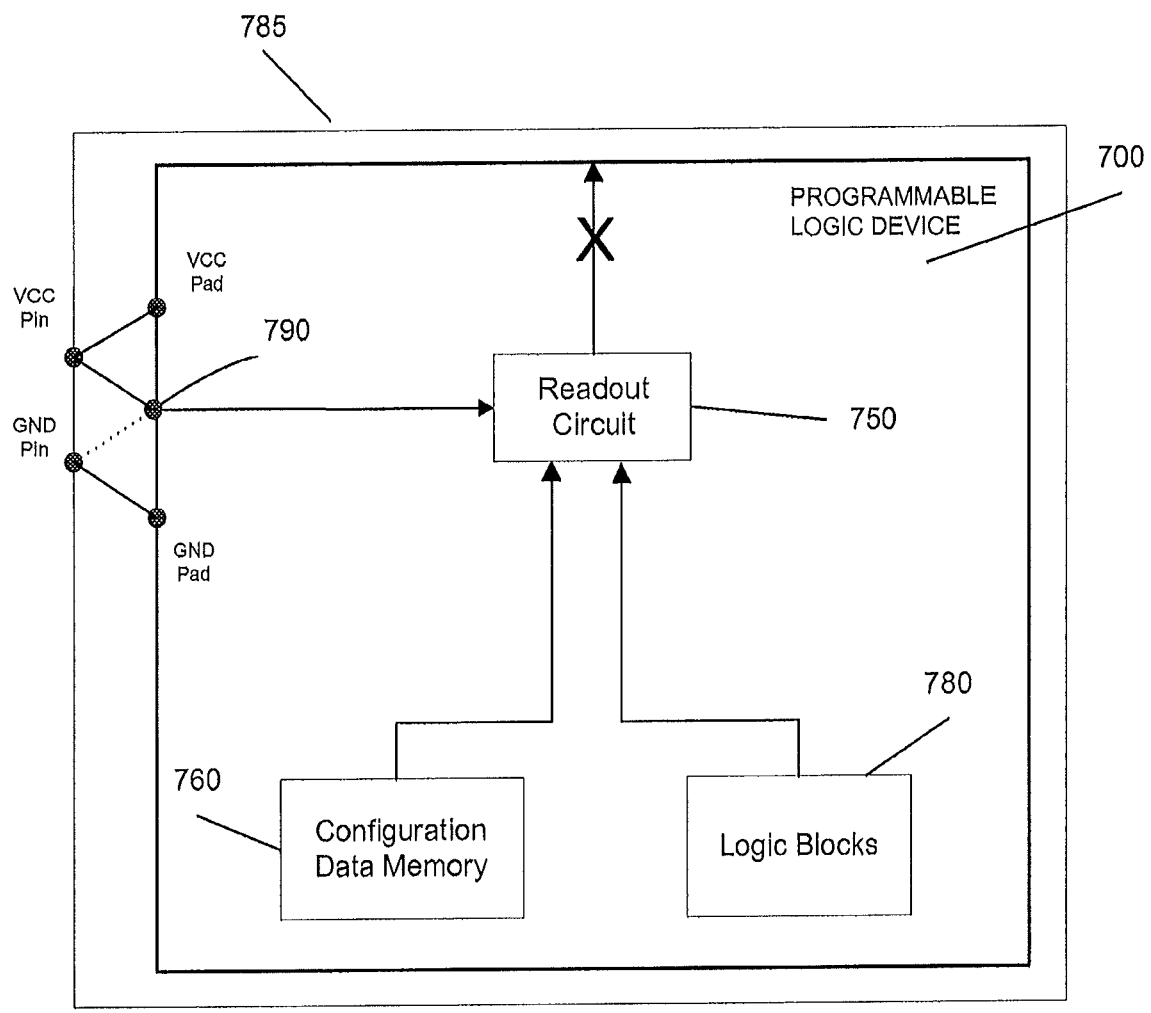
FIG. 7 illustrates a programmable logic device having a disabling element including an input pad and capable of preventing access to configuration and/or internal data according to an embodiment of the present invention.

FIG. 7 shows an integrated circuit 700 according to an embodiment of the invention. In this embodiment, the readout circuit 750 is connected to an input pad 790. The value on an input pad 790 can be used by the readout circuit to determine whether to allow reading of the data. In another embodiment, input pad 790 is connected to additional logic or memory, which is then connected to the readout circuit 750. The value on the input pad may also be used to in other embodiments described herein, such as to cause a break in a circuit line before or after the readout circuit 750.

In one embodiment, when input pad 790 is connected to a lead VCC pin of the logic device package 785, the reading of the data is not allowed. Connecting input pad 790 to a lead GND pin may allow reading of the data. In another embodiment, when input pad 790 is connected to the GND pin, the reading of the data is not allowed. Connecting input pad 790 to the VCC pin may allow reading of the data. One skilled in the art will recognize the many different combinations available including lead pins with varying voltages.

In one embodiment, input pad 790 is connected to a lead VCC pin of the logic device package 785 such that the end user cannot access the input pad 790. The VCC pin of the logic device may also be connected to VCC pad, which requires the same voltage input as the one that disables the readout circuit 750. The VCC pad could be the input that powers the device, or other input that is required for the logic device 700 to function properly. Thus, the end user cannot change the disabling element by putting a new voltage on the VCC pin or else the logic device 700 will not function properly. One skilled in the art will recognize the many different combinations available that would prevent changing the disabling element.

Figure 8:
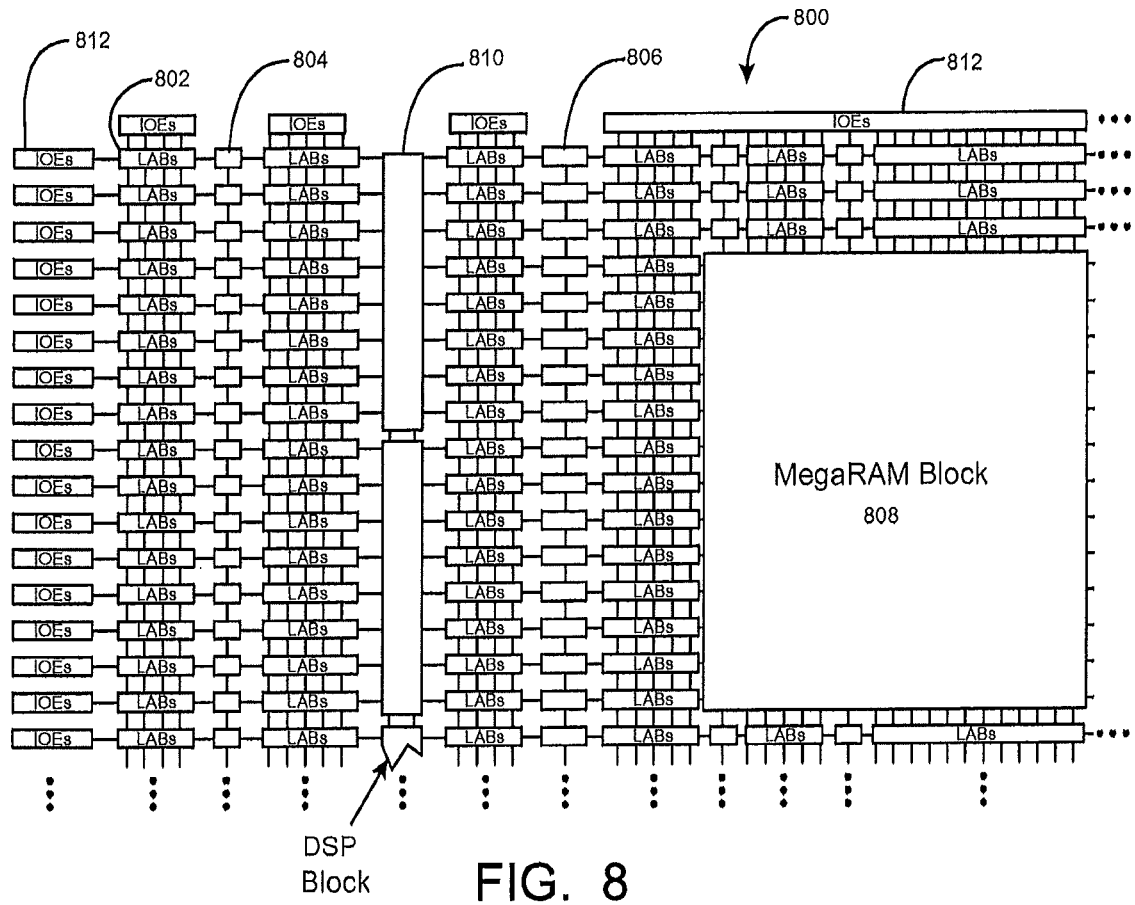
FIG. 8 is a simplified block diagram of a programmable logic device that does benefit by incorporating embodiments of the present invention.

FIG. 8 is a simplified partial block diagram of an exemplary high-density programmable logic device 800 wherein techniques according to the present invention can be utilized. PLD 800 includes a two-dimensional array of programmable logic array blocks (or LABs) 802 that are interconnected by a network of column and row interconnections of varying length and speed. LABs 802 include multiple (e.g., 10) logic elements (or LEs), an LE being a small unit of logic that provides for efficient implementation of user defined logic functions.

PLD 800 also includes a distributed memory structure including RAM blocks of varying sizes provided throughout the array. The RAM blocks include, for example, 512 bit blocks 804, 4K blocks 806 and an M-Block 808 providing 512K bits of RAM. These memory blocks may also include shift registers and FIFO buffers. PLD 800 further includes digital signal processing (DSP) blocks 810 that can implement, for example, multipliers with add or subtract features.

It is to be understood that PLD 800 is described herein for illustrative purposes only and that the present invention can be implemented in many different types of PLDs, FPGAs, and the other types of digital integrated circuits.

Figure 9:
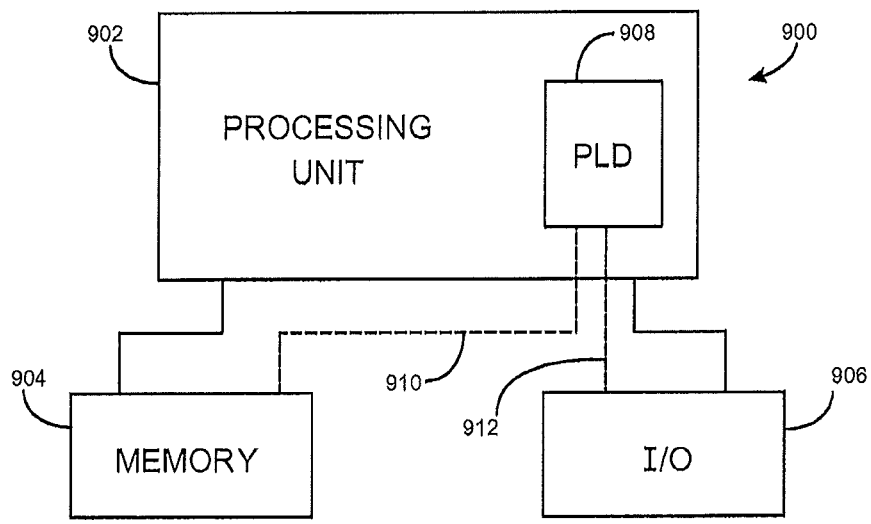
FIG. 9 is a block diagram of an electronic system that does benefit by incorporating embodiments of the present invention.

While PLDs of the type shown in FIG. 8 provide many of the resources required to implement system level solutions, the present invention can also benefit systems wherein a PLD is one of several components. FIG. 9 shows a block diagram of an exemplary digital system 900, within which the present invention may be embodied. System 900 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 900 may be provided on a single board, on multiple boards, or within multiple enclosures.

System 900 includes a processing unit 902, a memory unit 904 and an I/O unit 906 interconnected together by one or more buses. According to this exemplary embodiment, a programmable logic device (PLD) 908 is embedded in processing unit 902. PLD 908 may serve many different purposes within the system in FIG. 9. PLD 908 can, for example, be a logical building block of processing unit 902, supporting its internal and external operations. PLD 908 is programmed to implement the logical functions necessary to carry on its particular role in system operation. PLD 908 may be specially coupled to memory 904 through connection 910 and to I/O unit 906 through connection 912.

Processing unit 902 may direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 908 can control the logical operations of the system. In an embodiment, PLD 908 acts as a reconfigurable processor, which can be reprogrammed as needed to handle a particular computing task. Alternately, programmable logic device 908 may itself include an embedded microprocessor. Memory unit 904 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A programmable logic device, comprising:
a first logic block, wherein operation of the first logic block is programmable based at least in part on configuration data stored in configuration memory disposed on the programmable logic device;
a decoder communicatively coupled to the configuration memory, wherein the decoder:
receives encrypted data from a configuration device; and
determines the configuration data by decrypting the encrypted data using an encryption key;
a non-volatile memory communicatively coupled to the decoder, wherein the non-volatile memory is configured to store a plurality of bits using a plurality of fuses, and wherein each of the plurality of fuses is one-time programmable to store one bit of the encryption key;
an input pad configured to couple to a system high voltage or a system low voltage, wherein the configuration data cannot be read by a component of the programmable logic device from the configuration memory when the input pad is coupled to the system high voltage; and
a disabling fuse, wherein the programmable logic device selectably disables external access to the encryption key based at least in part on state of the disabling fuse.

2. The programmable logic device of claim 1, wherein the programmable logic device:
provides an integrated circuit device external from the programmable logic device access to the plurality of fuses before the disabling fuse is switched to a blown state; and
blocks the integrated circuit device from accessing the encryption key from the programmable logic device after the disabling fuse is switched to the blown state.

3. The programmable logic device of claim 1, wherein the programmable logic device disables reading the encryption key out from the programmable logic device to an external integrated circuit device when the disabling fuse is in a blown state.

4. The programmable logic device of claim 3, wherein the programmable logic device disables reading the encryption key by blocking a read enable signal.

5. The programmable logic device of claim 1, wherein the programmable logic device disables writing to the plurality of fuses when the disabling fuse is in a blown state.

6. The programmable logic device of claim 5, wherein the programmable logic device disables writing to the plurality of fuses by blocking a write enable signal.

7. The programmable logic device of claim 1, wherein:
the state of the disabling fuse is:
a first state when the disabling fuse is intact; and
a second state when the disabling fuse is blown; and
the programmable logic device:
enables external access to the plurality of fuses when the state of the disabling fuse is the first state; and
disables external access to the plurality of fuses when the state of the disabling fuse is the second state.

8. The programmable logic device of claim 1, comprising a readout circuit communicatively coupled to the disabling fuse and an output port of the programmable logic device, wherein the readout circuit:
enables readout of the configuration data, internal data used in the programmable logic device, or both from the programmable logic device to an external integrated circuit device when the disabling fuse is in a first state; and
disables readout of the configuration data, the internal data, or both from the programmable logic device to the external integrated circuit device when the disabling fuse is in a second state.

9. The programmable logic device of claim 8, wherein the internal data is indicative of an aspect of the programmable logic device intended to be kept secret.

10. The programmable logic device of claim 8, comprising a second logic block that stores the internal data.

11. The programmable logic device of claim 1, comprising a readout circuit communicatively coupled to the disabling fuse and an output port of the programmable logic device, wherein the readout circuit outputs data encrypted using the encryption key when the disabling fuse is in an intact state.

12. The programmable logic device of claim 1, wherein the configuration device comprises a computer system, a digital system, a processing system, a digital signal processing system, or a digital switching network.

13. The programmable logic device of claim 1, wherein each of the plurality of fuses is either left intact or blown to create a sequence that indicates the encryption key.

14. A configuration device comprising a memory unit that stores instructions executable by one or more processors to:
instruct a programmable logic device communicatively coupled to the configuration device to activate a one-time programmable fuse in the programmable logic device to disable external access to an encryption key stored in nonvolatile one-time programmable memory in the programmable logic device; and
communicate encrypted data from the configuration device to the programmable logic device to enable:
a decoder in the programmable logic device to determine configuration data by decrypting the encrypted data using the encryption key; and
the programmable logic device to configure functionality of one or more logic block in the programmable logic device based at least in part on the configuration data, wherein the configuration data is stored in configuration data memory disposed on the programmable logic device, and wherein an input pad configured to couple to a system high voltage or a system low voltage causes the configuration data to not be read by a component of the programmable logic device from the configuration memory when the input pad is coupled to the system high voltage.

15. The configuration device of claim 14, wherein the memory unit stores instructions executable by the one or more processors to communicate the encryption key from the configuration device to the programmable logic device to enable the programmable logic device to store each bit of the encryption key in a corresponding one of a plurality of fuses.

16. The configuration device of claim 14, wherein the memory unit stores instructions executable by the one or more processors to instruct the programmable logic device to activate the one-time programmable fuse after the encryption key is stored in the nonvolatile one-time programmable memory.

17. The configuration device of claim 14, wherein the configuration device comprises a computer system, a digital system, a processing system, a digital signal processing system, or a digital switching network.

18. The configuration device of claim 14, wherein:
the configuration device instructs the programmable logic device to activate the one-time programmable fuse by blowing the one-time programmable fuse;
the memory unit comprises random access memory, read only memory, a fixed disk medium, a flexible disk medium, flash memory, tape memory, or any combination thereof that stores a program comprising the instructions; and
the one or more processors comprises a central processing unit, a floating point coprocessor, a graphics coprocessor, a hardware controller, a microcontroller, another programmable logic device, or any combination thereof.

19. A method for operating a programmable logic device, comprising:
storing, in a non-volatile memory comprising a plurality of one-time programmable fuses, an encryption key to be used by a decoder in the programmable logic device to determine configuration data by decrypting encrypted data received from an external source, wherein the configuration data is used to program functionality of one or more logic blocks in the programmable logic device, wherein an input pad configured to couple to a system high voltage or a system low voltage causes the configuration data to not be read by a component of the programmable logic device from configuration memory disposed on the programmable logic device when the input pad is coupled to the system high voltage; and
activating a disabling fuse communicatively coupled to a readout circuit in the programmable logic device to disable access to the encryption key from the programmable logic device.

20. The method of claim 19, wherein:
storing the encryption key in the plurality of one-time programmable fuses comprises:
storing a first bit of the encryption key in a first fuse by blowing the first fuse; and
storing a second bit of the encryption key in a second fuse by leaving the second fuse intact; and
activating the disabling fuse comprises blowing the disabling fuse.

21. A programmable logic device, comprising:
a first logic block, wherein operation of the first logic block is programmable based at least in part on configuration data stored in configuration memory disposed on the programmable logic device;

a decoder communicatively coupled to the configuration memory, wherein the decoder:
  receives encrypted data from a configuration device; and
  determines the configuration data by decrypting the encrypted data using an encryption key;
a non-volatile memory communicatively coupled to the decoder, wherein the non-volatile memory is one-time programmable and configured to store one or more bits of the encryption key;
an input pad configured to couple to a system high voltage or a system low voltage, wherein the configuration data cannot be read by a component of the programmable logic device from the configuration memory when the input pad is coupled to the system high voltage; and
a disabling fuse, wherein the programmable logic device selectably disables write access to the encryption key based at least in part on state of the disabling fuse.

* * * * *